United States Patent [19]

Seidler

[11] Patent Number: 4,932,876

[45] Date of Patent: Jun. 12, 1990

[54] ADAPTER FOR REMOVABLE CIRCUIT BOARD COMPONENTS

[75] Inventor: Jack Seidler, Flushing, N.Y.

[73] Assignee: North American Specialties Corporation, Flushing, N.Y.

[21] Appl. No.: 244,066

[22] Filed: Sep. 13, 1988

[51] Int. Cl.$^5$ .............................................. H05K 1/00
[52] U.S. Cl. .................... 439/630; 439/876; 439/65
[58] Field of Search ................ 439/876, 651, 652, 68, 439/70–73, 80–84, 525, 65, 630–637

[56] References Cited

U.S. PATENT DOCUMENTS

| | | | |
|---|---|---|---|
| 2,977,562 | 3/1961 | Benson | 439/651 |
| 3,717,841 | 2/1973 | Mancini | 439/876 |
| 4,010,992 | 3/1977 | Crimmons et al. | 439/876 |
| 4,359,258 | 11/1982 | Palecek et al. | 439/876 |
| 4,631,639 | 12/1986 | Biraud | 439/876 |
| 4,768,965 | 9/1988 | Chang | 439/651 |

*Primary Examiner*—David Pirlot
*Attorney, Agent, or Firm*—Darby & Darby

[57] ABSTRACT

An adapter for removably mounting electronic components on a circuit board or the like is disclosed which includes an insulating base having a plurality of holes extending therethrough, with a plurality of contacts disposed within the holes. Each contact includes a board-engaging section which extends from the base for compliantly engaging a hole in the circuit board. Each contact further includes a base-engaging section which resiliently engages a hole within the base, with the base-engaging section strongly engaging the adapter base to provide for essentially permanent placement therein. Each contact further includes a component end including means for mating with a component placed in contact therewith, which means may comprise solder on the component-facing side of the component end of the contact. Typically, a component will be placed on the base with mating conductive strips in contact with the component ends of the contacts. The solder will be melted and cooled, forming a permanent junction of the component to the adapter. The combined modular unit of component and adapter is then plugged into a printed circuit board which includes holes for engaging with the board-engaging sections of the adapter contacts.

11 Claims, 2 Drawing Sheets

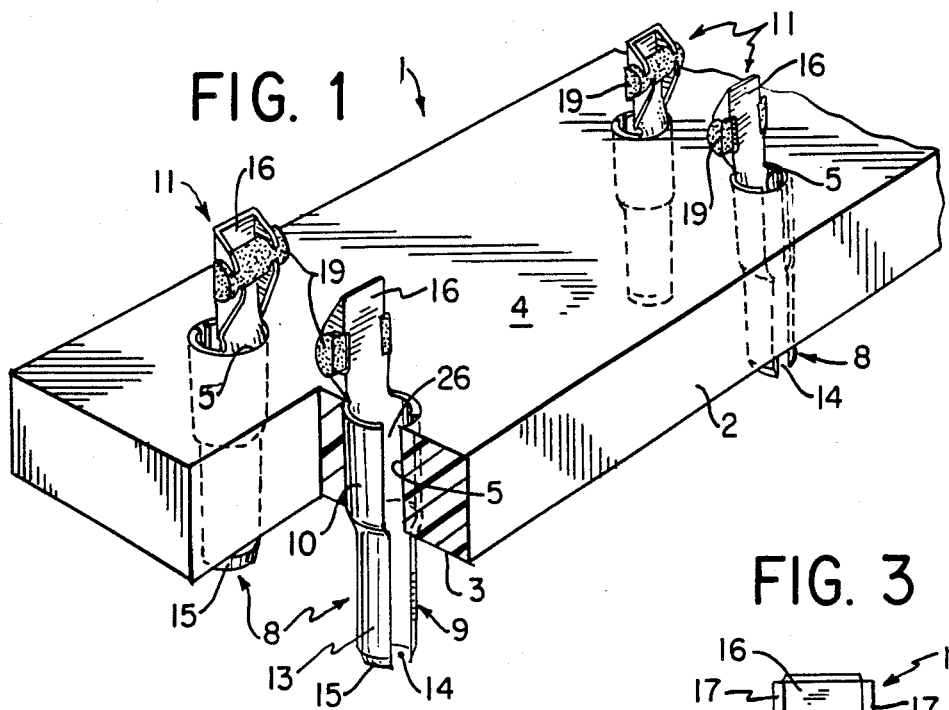
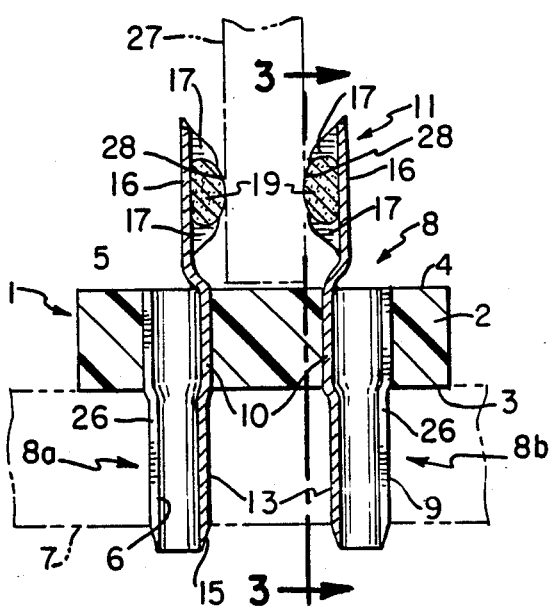
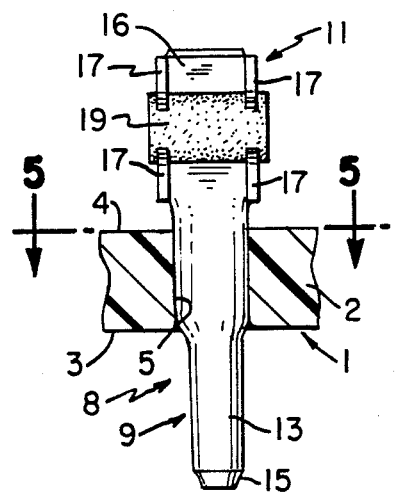
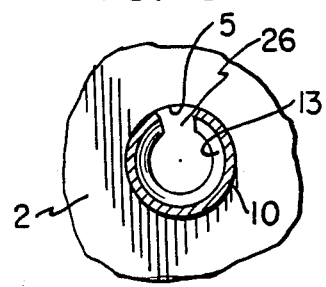

ADAPTER FOR REMOVABLE CIRCUIT BOARD COMPONENTS

TECHNICAL FIELD

This invention relates to adapters for removably mounting various components on a printed circuit board or the like.

BACKGROUND OF THE INVENTION

It is typical in the electronics industry to employ various terminal pins or posts to connect components to a printed circuit board. Generally, the circuit board includes a plurality of closely placed holes in a particular configuration to match the configuration of a particular component, with the holes through-plated with a conductive material. Each component usually includes mating pins or posts which correspond to the through-hole configuration. The component pins mate with the through-holes providing continuous conductive contact between the component and the circuit board. Usually the mating pins are soldered to the board, providing an essentially permanent connection. However, should the component fail, the solder must be melted to separate the component from the board. The component is then removed, a new component with mating pins inserted and soldered to the board. With the continuing trend to increasing component density on a circuit board, replacement is quite difficult to perform without damaging the component or disturbing adjacent components.

One alternative to a permanent connection on a circuit board is to include a socket on the circuit board for releasably engaging the component. However, such sockets are costly to construct and install, requiring customized board design, and require more board surface than available with closely spaced through-holes, which would reduce available board space. Consequently, there is a need in the art to provide apparatus for simplifying the removal and replacement of components from a circuit board without requiring excessive board space or costly circuit board or processing modifications.

SUMMARY

It is an object of the present invention to provide an adapter for removably mounting components on a circuit board without requiring excessive board space or costly board modifications or complex installation procedures.

It is a further object of the present invention to provide an adapter which relies on compliant conductive contact with conventional circuit board to allow ease of removal and replacement of individual components.

It is a further object of the present invention to provide an adapter which is compatible with standard printed circuit board design, including typical through-hole spacing and diameters.

These and other objects of the present invention are achieved by providing an adapter for removably mounting electronic components on a printed circuit board. The adapter includes a base, having a component side and a board side, with the base composed of an insulating material. The base further includes a plurality of channels extending from the component side to the board side. The adapter also includes a plurality of contacts, disposed in the channels, each contact including a circuit-board-engaging section or pin which extends from the board side of the base, the section or pin being sized for compliantly engaging a hole in a circuit board. The contact also includes a base-engaging section which is sized for compliantly engaging the channel in the base for retaining the contact therein. The contact also includes a contact end which extends from the component side of the base and includes means for mating with a component.

The adapter is usually assembled by providing a base of a particular configuration for permanently mounting a component thereon. The base includes a plurality of channels provided in a particular configuration matching both the circuit board and the component. The contacts are then inserted into the channels, with the board-engaging section preferably narrower than the base-engaging section in order to simplify insertion. Since the contacts are intended to be relatively permanently mounted in the adapter, the base-engaging section includes a greater resilient retention force than the board-engaging section in order to firmly lock the contact within the base, even during withdrawal of the adapter from the board. The board-engaging section similarly relies on resilience for conductive mating with the circuit board. However, since this is designed for ease of removal, the resilient retention force is less than that used to retain the contact within the base. Nevertheless, firm contact is provided for assuring optimum electrical conductivity.

The component-engaging end of the contact may desirably have a mass of solder attached near an end thereof. Generally, after the contacts are inserted in the base, a component is placed between a pair of opposed contact ends, with the component resting on the base. The solder elements are opposed to respective conductive areas on the component, and heat is applied to melt the solder, thereby permanently attaching the component to the contact and hence to the base. The component plus adapter may then be easily attached to a circuit board (as by plugging in using simple manual pressure) with the contact pins being sized to engage the standard pitch, diameter and depth of through-holes provided in a typical printed circuit board. Should the component fail or another component be desired for placement on the board, the component and adapter are simply pulled out of the board as a unit and a new component/adapter inserted. No heat need be applied to the circuit board, so that the integrity of both the board and other components is not adversely affected. Such ease in replacement substantially simplifies repair of a circuit board, reducing downtime after a component failure. In addition, such a modular assembly eases trouble shooting, as various components which are susceptible to failure may be quickly and easily replaced, either one at a time or in gross, further reducing downtime when a circuit board problem develops.

BRIEF DESCRIPTION OF THE DRAWINGS

FIG. 1 shows a perspective view partly broken away of an adapter element according to the invention.

FIG. 2 shows a cross-sectional view of the present invention, with a fragmentary portion of the component represented in phantom.

FIG. 3 shows a cross-sectional view of a portion of the device of FIG. 2 along line 3—3 thereof.

FIG. 5 shows a cross-sectional view of the device of FIG. 3 along line 4—4 thereof.

DETAILED DESCRIPTION OF THE INVENTION

Figure 4:
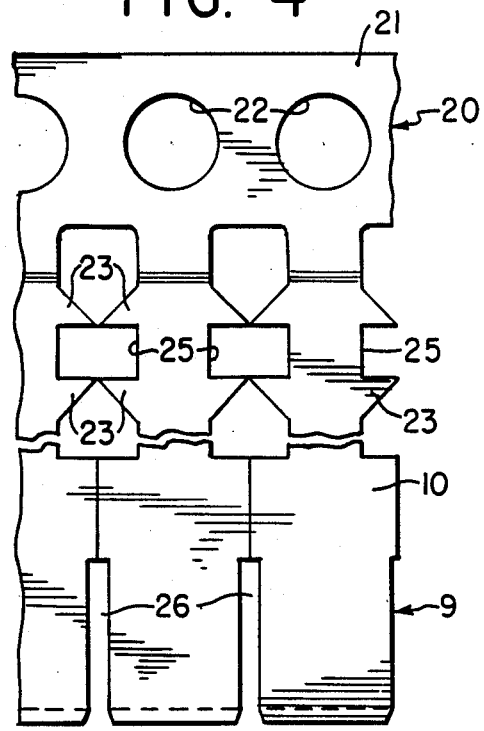
FIG. 4 shows a plan view of a blank for the contact portion of the device of FIGS. 1 and 2.

Referring to FIG. 1, an adapter for removably mounting components on a circuit board is shown. The adapter 1 includes a base 2 composed of an insulating material, such as a suitable moldable plastic. The base 2 is essentially rectangular, having a board side 3 and a component side 4. The base 2 further includes a plurality of holes or channels 5 therethrough configured to align with corresponding holes 6 in a circuit board 7, such as indicated in phantom in FIG. 2. Generally, such holes in a circuit board are on a square pitch of about 0.100 or 0.050 inches. While such spacings are illustrative, it will be understood that various other sizes and configurations may benefit from the present invention. In addition, while an essentially rectangular base 2 is discussed, it should be apparent that other shaped bases may be used as either the component or board configuration may dictate.

A plurality of contacts 8 are adapted to be placed in the channels 5. Each contact 8 has a board-engaging section 9, a base-engaging section 10 and a component-connecting end 11 which includes means described below for mating with a component. The contacts are preferably made by progressive stamping from a sheet of resilient conductive material (e.g., beryllium copper) to form a blank as shown in FIG. 4, from which individual contacts are formed by bending or rolling. In a preferred embodiment, the board-engaging section 9 comprises an essentially cylindrical section 13 having a narrow gap 14, and slightly larger in diameter than the corresponding hole 6 in board 7. The section 13 may also include a tapered end 15 to ease insertion. Utilizing such a slightly larger diameter provides an interference fit upon insertion, assuring optimum electrical and mechanical contact with the hole wall.

Each contact 8 further includes the base-engaging section 10 which similarly is essentially cylindrical and of slightly larger diameter than the corresponding channel 5 in the base 2, assuring an interference fit. The base-engaging section 10 is normally larger in diameter than the board-engaging section 9 to provide ease in inserting the contact 8 in the base 2 without affecting the board-engaging section 9. In addition, the base-engaging section 10 should be stiffer and have stronger resiliency than the board-engaging section 23 to provide essentially permanent retention of the contact in the base 2. The base-engaging section 10 further may include one or more longitudinal slits extending therethrough, or other optional or alternative structures, such as ribs or locking tabs, which are also contemplated for reducing the likelihood of separation of the contact from the base. However, such structures add complexity and cost to the design and are desirably kept at a minimum. Generally, proper consideration of the degree of resilience of the contact according to the invention will assure firm retention in the base.

Each contact further includes a component connecting end 11 having means for mating with a component placed in contact therewith. In one embodiment, the contact end includes a flat extension 16 having bent-up tabs 17 adapted for retaining a solder slug or mass 19 on a side facing the component. While various modes of retaining the solder 19 on the contact end may be used, it is preferred to use those described in U.S. Pat. No. 4,679,889 to Jack Seidler, issued July 14, 1987, which is hereby incorporated by reference.

In a preferred embodiment of the present invention, the contacts are formed by progressive stamping. FIG. 4 illustrates a blank 20 which may be used for producing the contacts 8 by multiple progressive stamping. A carrier strip 21 having indexing holes 22 is formed from a resilient conductive strip such as of beryllium copper. By stamping operations, the strip is formed with laterally extending sections each of which constitutes a blank for one of the contacts. Thus, blank 20 may have projections 23 which when bent at right angles to the plane of blank 20 to form the tabs 17 which define a channel 25 into which a solder mass 19 can be laid, as described in the above-cited patent. This can readily be done by laying a solder wire lengthwise of the blank 20 in channels 25 formed by the tabs 17, staking the tabs into such channels to retain the solder mass on the contact 8, and then cutting the solder wire to approximate length.

The base-engaging section 10 of the contact 8 may be formed by rolling the blank into a generally cylindrical shape as shown in FIG. 5. By leaving a gap 26, the cylindrical shape may be elastically compressed upon insertion of section 9 into the base channel 5, to hold the contact securely in the base. Similarly, the board-engaging section 9 of the contact 8 may be formed by rolling the portion 9 of the blank 20 into a generally cylindrical shape, with a similar but smaller gap.

In an unstressed condition, the diameter of the base-engaging section 10 is made larger than the diameter of the channel 5 in the base 2 into which the contact is to be placed. Accordingly, when the contact is forced into the channel 5, the cylindrical shape is compressed to a smaller diameter and its natural resilience causes the contact to be engaged firmly within the base 2.

The board-engaging section 9 of the contact is slightly smaller in diameter than section 10, and also is rolled into a nearly closed cylindrical shape as seen in FIG. 5. Preferably, the material of the board-engaging section 9 is made thinner than that of the base-engaging section 10, as by cold-working or skiving, to assist in providing that the resilient force exerted by the board-engaging section on its hole will be less than the force exerted by the base-engaging section on its channel.

Typically, an electronic component is placed between pairs of contact ends 11 with the solder masses 19 facing the component. Illustratively, the component may be a conventional memory module, but it will be understood by those skilled in the art that any electronic component having a generally similar configuration may be used with the present invention. Referring to FIG. 2, a memory module 27, shown in phantom, includes conductive terminal areas 28 which are placed in contact with the facing solder masses 19 of the pairs of contacts 8a and 8b. Upon applying appropriate heat, the solder melts, joining the module to the adapter, and securing electrical contact to the corresponding contacts. The combined memory module and adapter are thereafter readily insertable as a unit into holes 6 in a circuit board 7, also shown in phantom. The holes may be through-plated to provide good electrical contact with the board-engaging section 9 of each contact 8.

Figure 6:
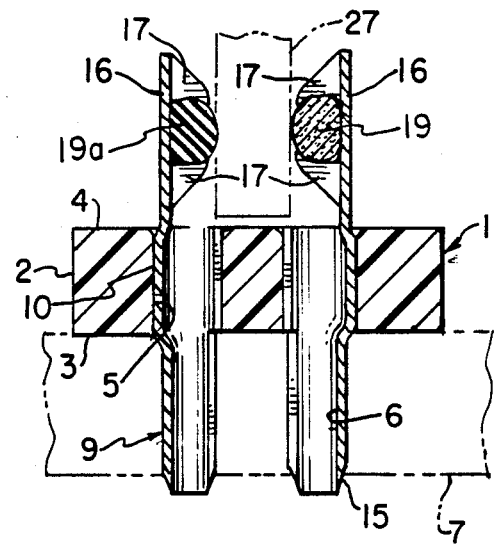
FIG. 6 is a view similar to FIG. 2 of a variation thereof.

As shown in FIG. 2, the solder masses 19 face outwardly from the cylindrical structures forming part of the contact 8. FIG. 6 shows an alternate form in which the solder masses may extend inwardly of the cylindrical structures, to provide a variant of the device of FIG. 2 with one mass 19a composed of an insulating material.

Figure 8:
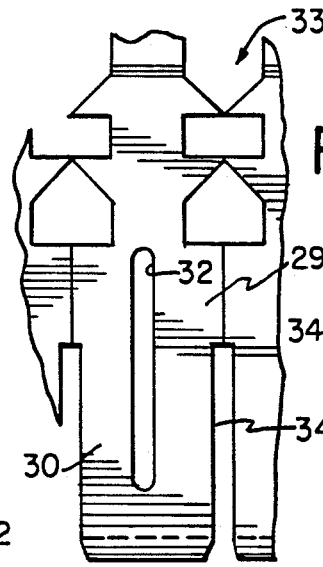
FIG. 8 is a view similar to FIG. 4, a blank for the contact of FIG. 7.
Figure 7:
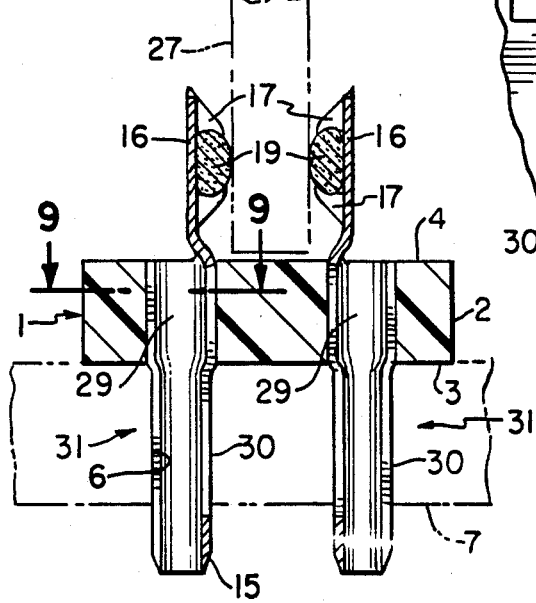
FIG. 7 is a view similar to FIG. 6, of a modification thereof.
Figure 9:
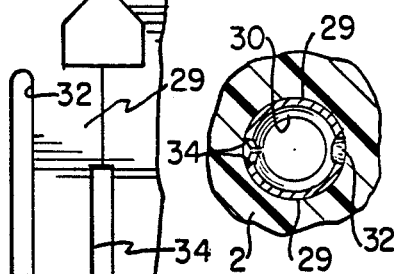
FIG. 9 is a fragmentary cross-sectional view of the device of FIG. 7, taken along line 9—9 thereof.
Figure 10:
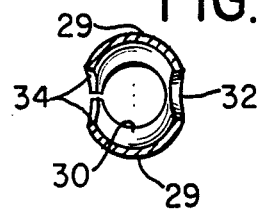
FIG. 10 is a cross-sectional view of the contact of FIG. 7 before insertion into the base.

FIGS. 7 to 10 show a further alternative form in which a base-engaging section 29 and a board-engaging section 30 of each contact 31 includes one or more gaps or slits 32 for providing resiliency. As shown in FIGS. 8 and 10, a blank 33 is formed with the slit 32 along the middle section 29 and the lower section 30. Thereafter, these sections are rolled into cylindrical form, so that the opposing edges 34 and the slit 32 form a configuration which is essentially two semi-cylinders. These two semi-cylinders are caused to be spaced apart slightly in the unstressed condition, as seen in FIG. 10, so that on entering the hole in either the base 2 or the board 7, the two cylinders are urged together against the resilient force of the material, to form essentially a single cylindrical surface, matched to the hole, as seen in FIG. 9. Such a structure is described in more detail in U.S. Pat. No. 4,752,250 granted June 21, 1988. In this way, the middle section 29 will firmly grasp and be retained essentially permanently in the base 2. In a fashion similar to that of FIGS. 1-5, the lower section 30 is formed with less resiliency by its dimensioning and/or configuration, so as to be normally retained in and to provide good contact with the board 7, but capable of being withdrawn from the board 7 when replacement is desired. While a single slit is shown, it will be understood that several slits may be used as required by the relative resiliency of the two contact sections, and that the number of slits in one section may vary from the adjoining section.

It will be understood that where a component has conductive contact areas only on one side, one of the solder slugs may be replaced by insulating material so as to permit the component still to be retained between the pair of contacts 8, but only one of which makes an electrical circuit as shown in FIG. 6. The other contact would thereby aid in mounting and securing.

The present arrangement is readily adapted to the standardized spacings (10 to the inch or 20 to the inch) of conventional printed circuit boards, such as 27. In such cases, the two contacts shown in FIG. 2 are spaced by 0.100 or 0.050 inch.

While FIG. 1 shows two pairs of contacts, each adapted to be soldered to corresponding conductive areas on the component to be mounted, it will be understood that as many pairs of contacts as desired may be included on the base 2, preferably with the conventional spacing of 0.100 or 0.050 inch.

Accordingly, the present invention permits mounting modules such as electronic components on an adapter which may then be plugged into conventional printed circuit boards for ready substitution of the component when desired. It will be understood that the component itself may be a circuit board with contact pads or conductive areas near its edge. Utilizing an adapter as described substantially simplifies troubleshooting of printed circuit board problems, while minimizing disruption of adjacent components during replacement. Thus, downtime is reduced and the costs of repair minimized. Also, the level of skill required to perform repairs is lessened, as a delicate unsoldering operation is avoided.

While the present invention has been shown and described in relation to particular contact designs and electronic components, it will be understood by those skilled in the art that various changes or modifications can be made without varying from the scope of the present invention.

What is claimed is:

1. An adapter for mounting electronic components on a circuit board comprising:
    a base, composed of an insulating material and including a plurality of holes extending therethrough, the base having a board side and a component side; and
    a plurality of electrically conductive resilient contacts, each disposed within a respective hole in the base, each contact including a board-engaging section which extends from the board side of the base, the board-engaging section being sized for resiliently engaging a hole in the circuit board; each contact further including a base-engaging section which is sized for resiliently engaging a hole in the base for retaining the contact therein; each contact also having a component-connecting end, extending from the component side of the base, the component end including means for mating with a component placed in contact therewith, at least one of the means for mating with the component comprising an insulating mass for mounting and securing the component between a pair of contacts.

2. The adapter of claim 1 wherein the contacts are arranged as opposed pairs for mating with opposite sides of a component placed therebetween.

3. The adapter of claim 1 wherein the holes in the base are arranged to essentially match a pattern of holes in the printed circuit board.

4. The adapter of claim 1 wherein the means for mating with the component comprises a solder mass placed on the component end of a contact, in a position to mate with a conductive area on the component.

5. The adapter of claim 1 wherein the holes in the base have a spacing matching that of the holes in a circuit board.

6. The adapter of claim 1 wherein the contact's board-engaging section comprises a hollow cylinder slightly larger in diameter than a corresponding hole in the circuit board.

7. The adapter of claim 1 wherein the board-engaging section includes at least one longitudinal slit therethrough.

8. The adapter of claim 1 wherein the contact's base-engaging section comprises a hollow cylinder slightly larger in diameter than a corresponding hole in the base.

9. The adapter of claim 1 wherein the base-engaging section includes at least one longitudinal slit extending therethrough.

10. The adapter of claim 1 wherein the contacts include one or more slits which extend therethrough along both the base-engaging and board-engaging sections.

11. The adapter of claim 1 wherein the board-engaging section of the contact is narrower than its base-engaging section.

* * * * *